Jan. 15, 1957

E. R. KRETZMER 2,777,956

SQUARE WAVE GENERATOR

Filed July 2, 1954

INVENTOR
E. R. KRETZMER
BY Hugh S. Wertz
ATTORNEY

United States Patent Office 2,777,956

Patented Jan. 15, 1957

2,777,956

SQUARE WAVE GENERATOR

Ernest R. Kretzmer, New Providence, N. J., assignor to Bell Telephone Laboratories, Incorporated, New York, N. Y., a corporation of New York Application July 2, 1954, Serial No. 441,026

7 Claims. (Cl. 250—36)

This invention relates to square wave generators and particularly to square wave generators employing semiconductor devices.

Semiconductor devices of a type which may be employed in the practice of the present invention comprise an integral body of semiconductor material having two regions of opposite conductivity type material, i. e., p-type and n-type, separated by a narrow zone of transition from material of one type conductivity to material of the opposite type conductivity. Semiconductor devices of this type have asymmetrically conducting properties and from the fact that this property is believed to be due to the junction between the p-type and n-type materials they have come to be known as p-n junction diodes. Generally speaking, easy flow or forward conduction is possible through the junction from one conductivity type to the other for a given potential difference between the conductivity types, and hard flow or reverse conduction for the opposite potential between the conductivity types.

The p-n junction diodes have come to be known for a new property which is distinct to them. In the reverse conduction characteristic of the diodes there is a region of substantially constant voltage over a wide range of currents. Important advantages of this property are that the break in the reverse conduction characteristic from a very high resistance to a low incremental resistance at nearly constant voltage is very sharp and that the critical reverse voltage at which the characteristic breaks is very stable, both with light and with temperature variations. Further, this critical voltage at the "knee" of the characteristic may be predicted and by a proper design may be obtained at any desired voltage over a range from a few volts to as high as a thousand volts.

In some p-n junction diodes, the reverse conduction characteristic is very noisy at the reverse conduction knee. As pointed out in an article entitled "Silicon P–N junction alloy diodes" by G. L. Pearson and B. Sawyer in the Proceedings of the Institute of Radio Engineers, November 1952, page 1348, the silicon p-n junction alloy diode is one example of diodes showing this noise characteristic at the reverse conduction or "breakdown" knee. The term "breakdown" has been associated with the reverse conduction knee because at a critical voltage the characteristic of the diode changes abruptly from that of a high resistance device to that of a low resistance device.

More recent investigations show that the silicon junction alloy diodes having very high incremental resistance in the reverse direction below breakdown exhibit a noise characteristic at the knee that is relatively large in its amplitude. This characteristic is distinctive inasmuch as it is so closely associated with the reverse conduction knee.

An object of this invention is to provide a circuit utilizing to advantage junction diodes having a noise characteristic in the range of the reverse conduction knee voltage.

A specific object of this invention is to provide a random square wave generator utilizing silicon junction alloy diodes having a noisy characteristic in the range of the reverse conduction knee.

In accordance with an illustrative embodiment of the invention, there is described in more detail below a circuit employing two-terminal p-n junction semiconductor devices connected in the circuit with a source of voltage for applying to the semiconductor devices reverse voltages substantially equal to the critical reverse voltage. By arranging two of the semiconductor devices in series opposition and applying the source of voltage to their common junction, a signal generator circuit is obtained in which current flows at all times through one or the other of the diodes. The selection of the current path is controlled by the random noise characteristics of both diodes which determines the instantaneous path of lowest effective impedance. As the diodes are alternately conducting and nonconducting, output voltages, taken across load resistors connected in series with each of the diodes, appear as random-period square waves.

Such a wave generator may be used for study and test purposes or as a source of calibrating voltage inasmuch as the square wave amplitude is adjustable over a wide range of accurately known values.

A more complete understanding of the invention, its objectives and its features will be obtained by consideration of the following detailed description read in conjunction with the attached drawings, in which.

Figure 3:
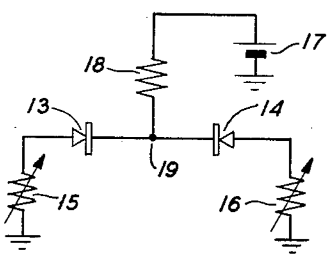
Fig. 3 is a schematic diagram of a circuit employing the principles of the present invention.
Figure 5:
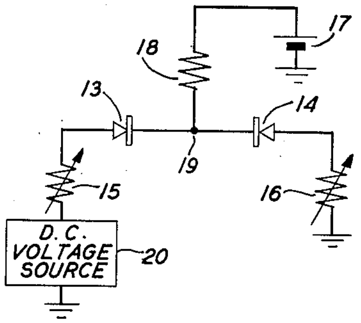
Figure 4A:
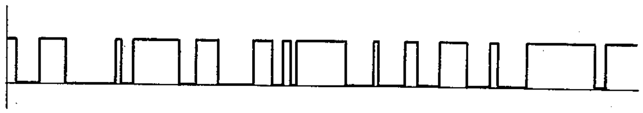
Figure 4B:
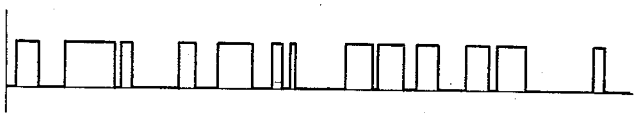

Figs. 4*a* and 4*b* show the square wave voltages appearing in the outputs of the circuit shown in Fig. 3; and Fig. 5 is a schematic diagram of an alternative embodiment of a circuit employing the principles of the present invention.

Figure 1:
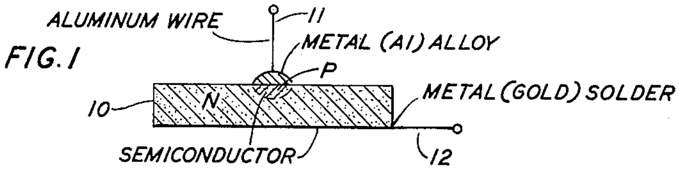
Fig. 1 illustrates a specific p-n junction semiconductor device of the type employed in the invention.

With specific reference to Fig. 1, there is shown a cross section of a p-n junction device constructed by alloying principles and having the desired characteristics in the reverse conduction characteristic. This device comprises a homogeneous n-type silicon crystal 10 to which an aluminum electrode 11 is alloyed by heating the crystal and bringing it in contact with the aluminum. This type of device is described in more detail in the Pearson-Sawyer article cited above. The p-type material is situated at the inner face between the unmelted silicon and the frozen out primary solid solution. A second metallic electrode 12, which may be gold, may be arranged to make ohmic contact with the opposite face of crystal 10.

Figure 2:
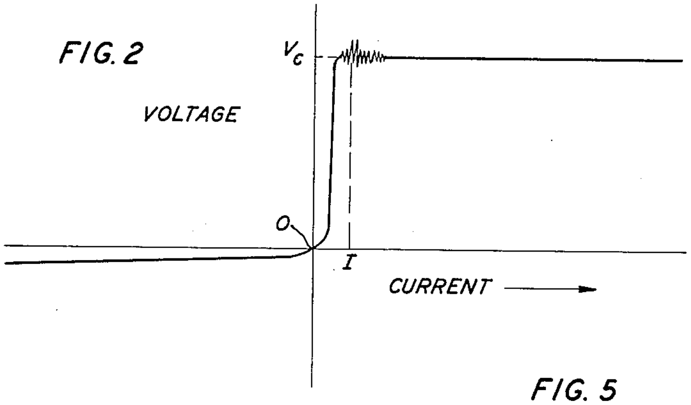
Fig. 2 illustrates a general conduction characteristic of a p-n junction device of the type shown in Fig. 1.

Fig. 2 illustrates a typical characteristic which may be obtained from a device as shown in Fig. 1. In the reverse conduction direction, which lies between zero volts and the knee of the curve, the characteristic is that of a very high resistance device. At the critical reverse voltage $V_c$, the characteristic breaks sharply from a very high resistance to a low incremental resistance of a substantially constant or decreasing voltage characteristic which extends over an appreciable range of currents greater than I, and includes several decades of current variation. As shown in Fig. 2, at the voltage $V_c$ on the reverse conduction characteristic, a certain noise phenomenon is observed which is confined to the area of the knee. This noise voltage is of a relatively large and randomly varied amplitude, and is prevalent in silicon junction alloy diodes having a very high incremental resistance in the reverse direction below breakdown.

In Fig. 3, p-n junction diodes 13 and 14 are connected in series opposition to ground through load resistors 15 and 16, respectively. A source of constant potential 17 is connected to the junction of diodes 13 and 14 through the resistor 18. In this circuit arrangement diodes 13 and 14 are oriented in the circuit so that the current flowing from the junction to ground potential flows in a reverse conduction direction through the diodes. Constant potential source 17 is chosen so that its potential is substantially larger than the critical voltage of the diode, and resistor 18 is chosen so that the current flow through it is approximately equal to I. The potential at junction 19 will then be substantially equal to the critical voltages of diodes 13 and 14. In the circuit arrangement, if the two diodes have identical critical voltages, both are equally likely to conduct but only one will conduct at a time. That diode having the least breakdown voltage at any instant, as dictated by the instantaneous noise voltages, will conduct. Thus, if at any time $t_1$ the instantaneous noise voltage in diode 13 is greater than that in diode 14, the latter will conduct the current I, and diode 13 will be nonconducting. This current I is nearly equal to the potential of source 17 less the breakdown voltage of diode 14 divided by the value of resistor 18, in the case where resistor 18 is large as compared to resistors 15 and 16. At another instant $t_2$, the instantaneous noise voltage in diode 14 may be greater than the instantaneous noise voltage in diode 13. At this instant the current I will flow through the diode 13 and resistor 15 to ground and diode 14 will be nonconducting. Thus, in the load resistors 15 and 16 the current at any instant is either zero or I and the voltage drop across the load resistors 15 either zero or of a value determined by the magnitude of the current I. Thus, as shown in Figs. 4*a* and 4*b*, the output voltages across load resistor 15 and load resistor 16, respectively, are square waves of constant amplitude and of random period.

If the critical voltages of the two diodes are not identical, then the diode having the lower breakdown voltage will tend to conduct more than fifty percent of the time. Compensation for the differences in critical voltages can be made by varying the relative values of resistors 15 and 16 until a perfect balance is obtained. In addition, as shown in Fig. 5 an appropriate voltage source 20 may be connected anywhere in series with the resistors 15 and 16 and diodes 13 and 14. It is clear that with this flexibility, balance between both sides of the circuit can be adjusted so that either one will conduct more than fifty percent of the time. No difficulty has been experienced in obtaining output duty factors from the range of zero percent to one hundred percent either by inserting a variable voltage source or by varying the relative values of resistors 15 and 16.

One further property observed in the silicon junction diodes is that they tend to exhibit negative resistance characteristics in the same region where the noise is observed. This negative resistance is believed to play an important roll in the action of the square wave generator, in accordance with the invention, by enhancing the speed of transition from conduction in one diode to conduction in the other.

While there are any number of possible values suitable for use in the circuit elements, the values used in a circuit as shown in Fig. 3 are:

| | | | |
|---|---|---|---|
| 13 | WE417A | 16 | 300 ohms |
| 14 | WE417A | 17 | 90 volts |
| 15 | 300 ohms | 18 | 1 megohm |

It is understood that the above described arrangement is merely illustrative of the application of the principles of the invention. Obviously the square wave generator as shown in Figs. 3 and 5 will operate in accordance with the principles of the invention by reversing the polarities of the potential sources and diodes shown in the figures. Numerous other arrangements may be devised by those skilled in the art without departing from the spirit or scope of the invention.

What is claimed is:

1. A wave generator including a plurality of semiconductor asymmetrically conducting devices having like terminals connected together, said devices having a reverse conduction characteristic including a region of high resistance for applied voltages below a critical value and a region of substantially constant voltage with superimposed noise voltages above said critical voltage, a constant potential source of a potential at least equal to said critical value, and means for connecting said devices in parallel with said source, said devices being connected in reverse conduction relationship with respect to said source whereby current flows through the device having the lowest instantaneous noise voltage.

2. A wave generator including a pair of semi-conductor asymmetrically conducting devices having like terminals connected together, said devices having a reverse conduction characteristic including a region of high resistance for applied voltage below a critical value and a region of substantially constant voltage with superimposed noise voltages above said critical voltage, a constant potential source of a potential greater than said critical value, and means for connecting each of said devices in parallel with said source to form current paths with respect thereto, said devices being oriented in a reverse conduction relationship to said source whereby current flows through the path having the device with the least instantaneous noise voltage.

3. A wave generator according to claim 2 in further combination with a pair of load resistors connected in series with each said device in said current paths.

4. A square wave generator comprising a pair of p-n junction diodes having a reverse conduction characteristic including a region of high resistance with applied voltages below a critical value and a region of substantially constant voltage with superimposed noise voltages above said critical voltage, a constant potential source of a potential greater than said critical value, a pair of load resistors each of which is connected in series relationship with said diode to comprise a pair of current paths, and means including a resistor for connecting said source in parallel with said current paths, said source being oriented with respect to said paths to provide reverse conduction through said diodes whereby conduction occurs in the path having the diode of least noise voltage at any given instant and square wave voltages appear across said load resistors.

5. A square wave generator according to claim 4 in further combination with a second source of potential connected in series with one of said diodes for altering the duty factor of said diode.

6. A wave generator comprising a closed circuit configuration including, in combination, a pair of semiconductor devices having like terminals connected together, said devices having a reverse conduction characteristic which includes a critical breakdown voltage with superimposed random noise voltage, means including a source of constant potential for biasing the said devices to the critical breakdown potential, means including an impedance for limiting the current through said devices to the region of said noise voltage, means for connecting said devices and one terminal of said potential source to a common junction so that the current flow is in a reverse direction through said device having the lowest instantaneous noise voltage, means including an impedance in series with each of said devices across which is developed the output signal, and means for connecting said impedances to the other terminal of said source.

7. A wave generator according to claim 6 in further combination with an additional source of potential in series with one of said semiconductor devices.

References Cited in the file of this patent

UNITED STATES PATENTS

| | | |
|---|---|---|
| 2,576,026 | Meacham | Nov. 20, 1951 |
| 2,618,753 | Van Mierlo | Nov. 18, 1952 |

OTHER REFERENCES

Article: "Silicon P–N Junction Alloy Diodes," by G. L. Pearson and B. Sawyer, Proc. IRE, November 1952, pages 1348.